United States Patent
Leo et al.

(10) Patent No.: US 7,274,141 B2
(45) Date of Patent: Sep. 25, 2007

(54) INVERTED ORGANIC LIGHT EMITTING DIODE WITH DOPED LAYERS

(75) Inventors: Karl Leo, Dresden (DE); Jan Blochwitz-Nimoth, Dresden (DE); Martin Pfeiffer, Dresden (DE)

(73) Assignee: NovaLED GmbH, Dresden (DE)

( * ) Notice: Subject to any disclaimer, the term of this patent is extended or adjusted under 35 U.S.C. 154(b) by 182 days.

(21) Appl. No.: 10/484,140

(22) PCT Filed: Jul. 5, 2002

(86) PCT No.: PCT/DE02/02467

§ 371 (c)(1),
(2), (4) Date: Aug. 6, 2004

(87) PCT Pub. No.: WO03/012890

PCT Pub. Date: Feb. 13, 2003

(65) Prior Publication Data

US 2004/0251816 A1  Dec. 16, 2004

(30) Foreign Application Priority Data

Jul. 20, 2001  (DE) ................. 101 35 513

(51) Int. Cl.
*H01J 1/62* (2006.01)
*H01J 63/04* (2006.01)

(52) U.S. Cl. ...................... 313/506; 313/504
(58) Field of Classification Search ............. 313/504, 313/498–512

See application file for complete search history.

(56) References Cited

U.S. PATENT DOCUMENTS 6,046,543 A * 4/2000 Bulovic et al. ............. 313/504

FOREIGN PATENT DOCUMENTS

GB  1 017 118  * 7/2000

OTHER PUBLICATIONS

Bulovic et al., "A surface-emitting vacuum-deposited organic light emitting device," Appl. Phys. Lett., 70 (22), Jun. 2, 1997, pp. 2954-2956.

"Polymer Preprints, Japan," The Society Of Polymer Science, Japan, vol. 47, No. 9, pp. 1940-1941, 1998.

O plus E, vol. 22, No. 11, pp. 1416-1421, 2000.

Yamamori et al., "Doped organic light emitting diodes having a 650-nm-thick hole transport layer," J. Appl. Phys. Lett., 72 (17), pp. 2147-2149, 1998.

Blochwitz et al., "Low voltage light emitting diodes featuring doped phthalocyanine as hole transport material," Appl. Phys. Letts., 73 (6), pp. 729-731, 1998.

Pfeiffer et al., Low-Voltage Inverted Transparent Vacuum Deposited Organic Light-Emitting Diodes Using Electrical Doping:, Applied Physics Letters, vol. 81, No. 5, Jul. 29, 2002, pp. 922-924.

(Continued)

*Primary Examiner*—Joseph Williams
*Assistant Examiner*—Bumsuk Won
(74) *Attorney, Agent, or Firm*—Baker Botts LLP; Manu J. Tejwani

(57) ABSTRACT

A light emitting component with organic layers, e.g., an organic light-emitting diode, which includes a substrate, at least one light emitting layer, and at least one charge carrier transport layer, having a cathode on the substrate and light emission through the anode. The light emitting component may further include a transport layer that is p-doped with an organic material.

23 Claims, 2 Drawing Sheets

OTHER PUBLICATIONS

Dobbertin et al., "Inverted Hybrid Organic Light-Emitting Device With Polyethylene Dioxythiophene-Polystyrene Sulfonate as an Annode Buffer Layer", Applied Physics Letter, vol. 83, No. 24, Dec. 15, 2003, pp. 5071-5073.

Parthasarathy et al., "A Metal-Free Cathode for Organic Semiconductor Devices", Applied Physics Letters, vol. 72, No. 17, Apr. 17, 1998, pp. 2138-2140.

Hung et al., "Interface Engineering in Preparation of Organic Surface-Emitting Diodes" Applied Physics Letters, vol. 74, No. 21, May 24, 1999, pp. 3209-3211.

Li et al., "Fabrication and Electroluminescence of Double-Layered Organic Light-Emitting Diodes With the $Al_2O_3$/AlCathode", Applied Physics Letter, vol. 70, No. 10, Mar. 10, 1997, pp. 1233-1235.

Hung et al., "Enhanced Electron Injection in Organic Electroluminescense Devices Using an Al/LiF Electrode", Applied Physics Letter, vol. 70, No. 2, Jan. 13, 1997.

Kido et al., "Bright Organic Electroluminescent Devices Having a Metal-Doped Electron-Injecting Layer", Applied Physics Letters, vol. 73, No. 20, Nov. 16, 1998, pp. 28666-2868.

Kim et al., "Plasma Damage-Free Sputtering of Indium Tin Oxide Cathode Layers for Top-Emitting Organic Light-Emitting diodes", Applied Physics Letters, vol. 86, 2005, 183503-1 to 183503-3.

Burrows et al., "Semitransparent Cathodes for Organic Light Emitting Devices", Joural of Applied Physics, vol. 87, No. 6, Mar. 15, 2000, pp. 30803085.

* cited by examiner

US 7,274,141 B2

INVERTED ORGANIC LIGHT EMITTING DIODE WITH DOPED LAYERS

CROSS-REFERENCE TO RELATED APPLICATIONS

This application has been filed under 35 U.S.C. 371 and claims priority to International Application No. PCT/DE02/02467, which was filed on Jul. 5, 2002 and which claims priority to German Application No. DE 101 35 513.0, which was filed on Jul. 20, 2001.

BACKGROUND OF THE INVENTION

The invention relates to a light-emitting component having organic layers. More particularly to an organic light-emitting diode according to the generic clause of claim 1. Organic light-emitting diodes, since the demonstration of low working voltages by Tang et al. 1987 [C. W. Tang et al., *Appl. Phys. Lett.* 51 (12), 913 (1987)], have been promising candidates for large-area displays. They consist of a sequence of thin (typically 1 nm to 1 µ) layers of organic material, preferably vapor-deposited under vacuum or applied from solution, e.g., by centrifuging. After electrical contact by metal layers, thin organic layers form manifold electronic or optoelectronic components, such as for example diodes, light-emitting diodes, photodiodes and transistors, whose properties enable them to compete with established components based on inorganic layers.

In the case of organic light-emitting diodes (OLEDs), injection of charge carriers (e.g., electrons from one side or holes from the other side) from the contacts into the intervening organic layers, as a result of an external applied voltage, results in the formation of excitons (electron-hole pairs). The radiant recombination of the excitons allows light to be generated and emitted from the light-emitting diode.

The advantage of organic components over conventional inorganic components (e.g., semiconductors such as silicon, gallium arsenide) is that it is possible to produce very large-area display elements (e.g., Bildschirme, screens). The organic starting materials are relatively economical compared to the inorganic materials (less outlay of material and energy). Furthermore, since these materials require low processing temperature, compared to inorganic materials, they can be applied to flexible substrates allowing a whole series of new applications in illumination and display technology.

The usual arrangement of such components represents a sequence of one or more of the following layers:
1. Carrier, substrate
2. Base electrode, hole-injecting (plus pole), transparent
3. Hole-injecting layer
4. Hole-transporting layer (HTL)
5. Light-emitting layer (EL)
6. Electron-transporting layer (ETL)
7. Electron-injecting layer
8. Cover electrode, generally a metal with low work of emergence, electron-injecting (minus pole)
9. Capsule, to exclude environmental influences This is the most general case; usually some layers are omitted (other than 2, 5 and 8), or one layer combines several properties.

The emergence of light takes place in the sequence of layers described, through the transparent base electrode and the substrate, while the cover electrode consists of non-transparent metal layers. Current materials for this purpose are indium tin oxide (ITO) and kindred oxide semiconductors as injection contact for holes (a transparent degenerate semiconductor). For electron injection, base metals such as aluminum (Al), magnesium (Mg), calcium (Ca) or a mixed layer of Mg and silver (Ag), or such metals in combination with a thin layer of a salt such as lithium fluoride (LiF) are employed.

For many applications, however, it is desirable that the emission of light take place not towards the substrate but through the cover electrode. Examples of this are displays based on organic light-emitting diodes built up on silicon or plastic substrates (e.g., U.S. Pat. No. 5,736,754 (S. Q. Shi et al.) filed Nov. 17, 1995; U.S. Pat. No. 5,693,956 (S. Q. Shi et al.) filed Jun. 29, 1996), or displays where a textured filter or absorber layer is to be applied to the organic light-emitting diodes (e.g., U.S. Pat. No. 6,137,221 (D. B. Roitman et al.), filed Jul. 8, 1998; C. Hosokawa et al., *Synthet. Metal.* 91, 3-7 (1997); G. Rajeswaran et al., SID 00 *Digest* 40.1 (2000)).

The emission through the cover electrode, i.e., the cathode, can be achieved for the sequence of organic layers described above, where a very thin conventional metal electrode is applied. Since this will not achieve any transverse conductivity, at thicknesses exhibiting sufficiently high transmission, an additional transparent contact material must be applied thereon, e.g., ITO or zinc-doped indium oxide (e.g., U.S. Pat. No. 5,703,436 (S. R. Forrest et al.) filed Mar. 6, 1996; U.S. Pat. No. 5,757,026 (S. R. Forrest et al.) filed Apr. 15, 1996; and U.S. Pat. No. 5,969,474 (M. Arai) filed Oct. 24, 1997). Other known structures of this type provide an organic interlayer to improve electron injection (e.g., G. Parthasarathy et al., *Appl. Phys. Lett.* 72, 2138 (1997); G. Parthasarathy et al., *Adv. Mater.* 11, 907 (1997), partly doped with atoms of metal such as lithium G. Parthasarathy et al., *Appl. Phys. Lett.* 76, 2128 (2000)). On these, a transparent contact layer (usually ITO) is then applied. Indeed, ITO is not well suited to electron injection (cathode), thus elevating the operating voltages of such an LED.

An alternative possibility to provide a transparent cathode consists in reversing the sequence of layers, i.e., making the hole-injecting transparent contact (anode) the cover electrode. However, such an inverted structure, with the anode on the LED, presents considerable difficulties in practice. Metal electrodes exhibiting acceptable transparency must be sufficiently thin, so a closed layer is not formed or the transverse conductivity is not enough to bring about a homogeneous flow of current through the components. If the sequence of layers is concluded by the hole-injecting layer, then the usual material for hole injection, ITO (or an alternative material) must be applied to the organic sequence (e.g., U.S. Pat. No. 5,981,306 (P. Burrows et al.) filed Sep. 12, 1997). This generally requires process technology poorly compatible with the organic layers, sometimes leading to damage. An improvement may be provided by protective layers, but they in turn raise the operating voltage of the component, by increasing the total organic thickness of the layer (e.g., U.S. Pat. No. 6,046,543 (V. Bulovic et al.) filed Dec. 23, 1996; Z. Shen, *Science* 276, 2009 (1997)).

A more serious disadvantage is that the conventional method of producing the light-emitting diodes requires the hole-injecting anode contact to exhibit as high a work-function as possible. This is necessary because the organic layers are nominally undoped, and hence an efficient injection is possible only if there is as low a potential barrier as possible. To attain low operating voltages and high efficiencies, therefore, it is necessary to perform a specific preparation of the surface of the hole-injecting material (e.g., C. C. Wu et al., *Appl. Phys. Lett.* 70, 1348 (1997); G. Gu et al., *Appl. Phys. Lett.* 73, 2399 (1998)). The work-function of ITO may for example be altered by ionization and/or oxygen plasma treatment, from about 4.2 up to about 4.9 eV. This has a great influence on the efficiency of hole injection and hence on the operating voltage of an OLED. When applying the hole-injecting contact material to the organic layers, these methods of surface preparation cannot be used. As a result, in the case of inverted organic light-emitting diodes the operation voltages are ordinarily a good deal higher, leading to lower output efficiencies (ratio of light emission to electrical output) (e.g., V. Bulovic et al., *Appl. Phys. Lett.* 70, 2954 (1997)).

For the reasons given, there is as yet no inverted structure exhibiting optoelectronic characteristics as good as the corresponding non-inverted structure. Therefore, the operating voltages of such inverted OLEDs are higher and the efficiencies lower compared to OLEDs of conventional layer make-up.

The inverted arrangement permits a simple integration of the OLED with standard driver electronics, such as CMOS technology with amorphous Si-NFETs. Furthermore, the arrangement of the cathode underneath the organic layers has the advantage that it is better protected from environmental influences such as oxygen and water. As is known, this has negative influences on long-term stability, e.g., due to detachment manifestations of the cover electrodes. Since the classical hole-injecting transparent anode material ITO itself already contains oxygen, these effects should be reducible with an inverted structure. Another advantage of the inverted structure is that a very flat semiconductor substrate may be employed, whereas in the classical structure, with ITO as the ground contact, some residual roughness of the ITO is unavoidable. The roughness may lead to pinholes (partial through-contactings), which may lead to problems with long-term stability.

For light-emitting diodes of inorganic semiconductors, it has long been known that highly doped boundary layers can produce thin space-charge zones, which lead to efficient injection of charge carriers through tunnel-effects even if energetic barriers are present. The doping of organic material was described in U.S. Pat. No. 5,093,698 filed Feb. 12, 1991. But in practical applications, this leads to problems with the energy adequation of the various layers and reduction of efficiency of the LEDs with doped layers. This can be improved by the choice of suitable block layers (e.g., Patent Application DE 100 58 578.7, filed Nov. 24, 2000).

SUMMARY OF THE INVENTION

The object of the invention consists of providing an inverted organic light-emitting diode emitting light through the cover contact, operable on a reduced operating voltage and exhibiting an enhanced efficiency of light emission. It is a further object, to provide protection of all organic layers from damage due to the production of the transparent cover contact (According to the present invention, all layers with a transmission >50% within the light emission range of the OLED are termed transparent).

According to the present invention, the object is accomplished, in combination with the features specified in the generic clause of claim 1, in that the hole-transporting layer is p-doped with an organic material. The transporting layer may comprise greater thicknesses than is possible with undoped layers (typically 20-40 nm), without drastically increasing the operating voltage.

A thin space charge zone is achieved inside the p-doped hole-transporting layer close to the anode by which the charge carrier can be efficiently injected. On the basis of tunnel injection, the very thin space charge zone will no longer hinder injection even at a high energy barrier. Advantageously the charge carrier transport layer is doped with an admixture of an organic or an inorganic substance (i.e., dopant). Owing to the enhanced conductivity of the doped organic layer, this can be made thick enough to protect all layers underneath from damage due to production of the transparent cover contact.

X. Zhou et al., *Appl. Phys. Lett.* 78, 410 (2001) discloses that organic light-emitting diodes, having doped transporting layers, exhibit efficient light emission only if the doped transporting layers are combined in a suitable manner with block layers. In an advantageous embodiment, therefore, the inverted light-emitting diodes are likewise provided with block layers. Each block layer is located between the charge carrier transporting layer and a light-emitting layer of the component in which the conversion into light of the electrical energy of the charge carrier injected through the component by flow of current takes place. According to the present invention, the substances of the block layers are chosen so with the voltage applied (in the direction of the operating voltage), owing to their energy level, the majority of charge carriers (HTL side holes, ETL side electrons) are not substantially impeded at the charge carrier transport layer/block layer boundary (low barrier), but the minority charge carriers are efficiently arrested at the light-emitting layer/block layer boundary (high barrier).

An advantageous embodiment of a structure of an inverted OLED according to the invention contains the following layers:
1. Carrier, substrate
2. Electrode, usually a metal with low work of emergence, electron-injecting (cathode=minus pole)
3. n-doped electron-injecting and -transporting layer
4. Thin electron-side block layer of a material whose energy levels match the energy levels of the layers surrounding them
5. Light-emitting layer (possibly doped with emitter dye)
6. Hole-side block layer (typically thinner than layer 7) of a material whose energy levels match the energy levels of the layers surrounding them
7. Layer injecting and transporting p-doped holes
8. Electrode, hole-injecting (anode=plus pole), preferably transparent
9. Capsuling, to exclude environmental influences According to the present invention, only one block layer may be used, if the energy levels of the injecting and transporting layer and the light-emitting layer match each other on one side. Sometimes also, only one side (hole- or electron-conducting) may be doped. Furthermore, the functions of charge carrier injection and charge carrier transport in layers 3 and 7, described above, may be divided among several layers, of which at least one is doped. If the doped layer is not located immediately at the electrode in question, all layers between the doped layer and the electrode in question must be so thin that they can be efficiently tunneled through by charge carriers. These layers can be thicker if they exhibit a very high conductivity (the path resistance of these layers must be less than that of the neighboring doped layer). Thus, the interlayers may be regarded in the spirit of the invention as part of the electrode. The molar doping concentrations are typically in the range from about 1:10 to 1:10000. If the dopant agents are substantially smaller than the matrix molecules, in exceptional cases, there may be more dopant agents than matrix molecules in the layer (up to 5:1). The dopant agents may be organic or inorganic.

DESCRIPTION OF THE DRAWINGS

The invention will now be described in still further detail in terms of embodiments by way of example. The drawings show the following.

DESCRIPTION OF THE PREFERRED EMBODIMENTS

Figure 1:
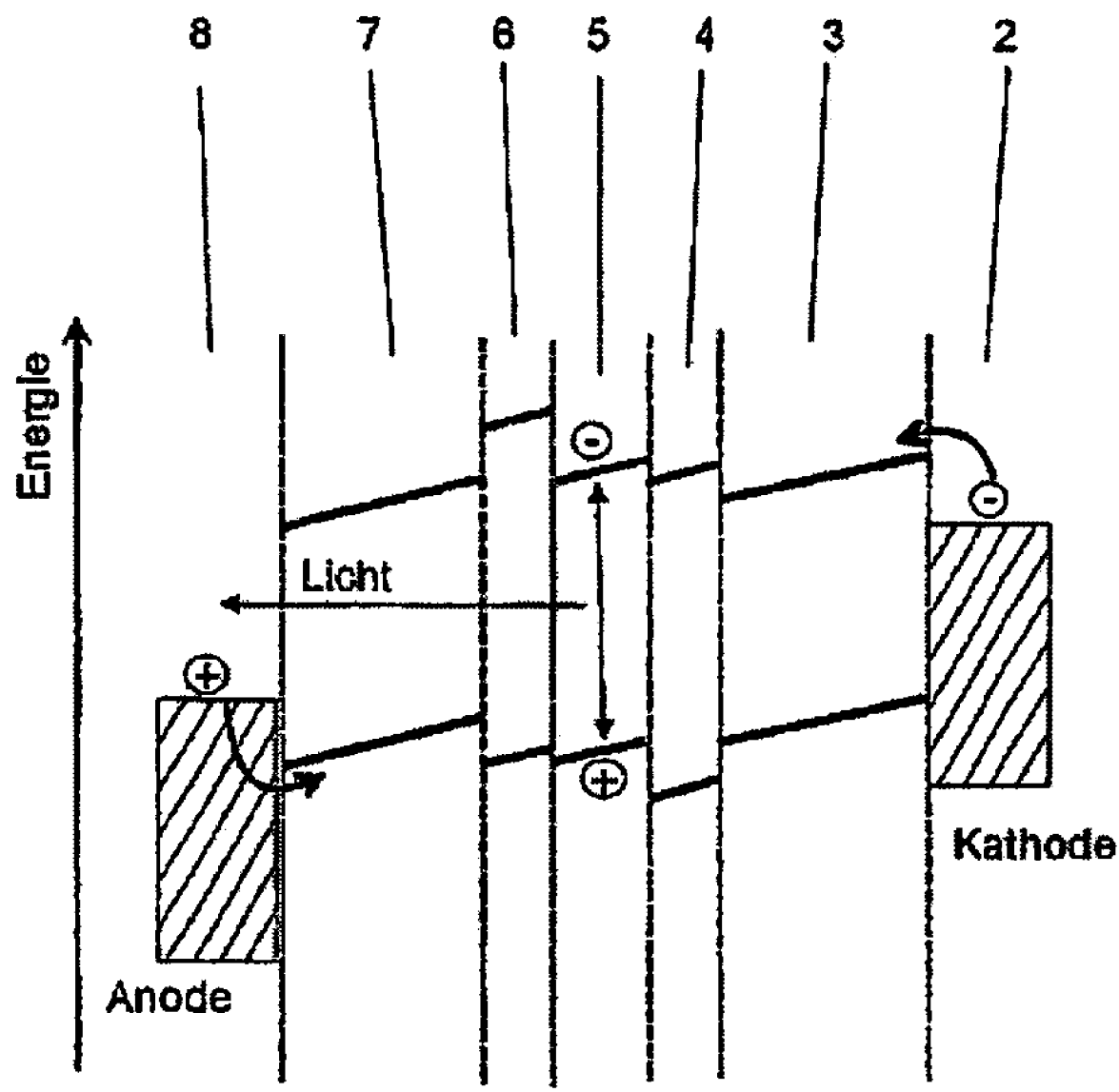
FIG. 1 is an energy diagram of an inverted OLED in a conventional embodiment (e.g., no doping and the numerical data relate to the layer structure of an inverted OLED as described above)

In the embodiment shown in FIG. 1, no space charge zone occurs at the hole-injecting contact. This embodiment calls for a low energy barrier for hole injection. Sometimes, this may not be achieved with available materials. Hence the injection of holes from the anode is less effective than for the conventional structure, where the work-function of the anode can be modified. Thus, the OLED exhibits an elevated operating voltage.

Figure 2:
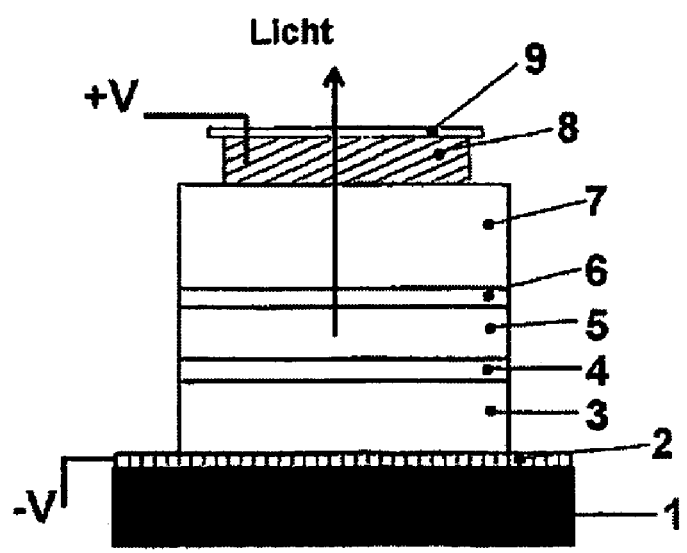
FIG. 2 is an energy diagram of an inverted doped OLED with block layers.
Figure 2:
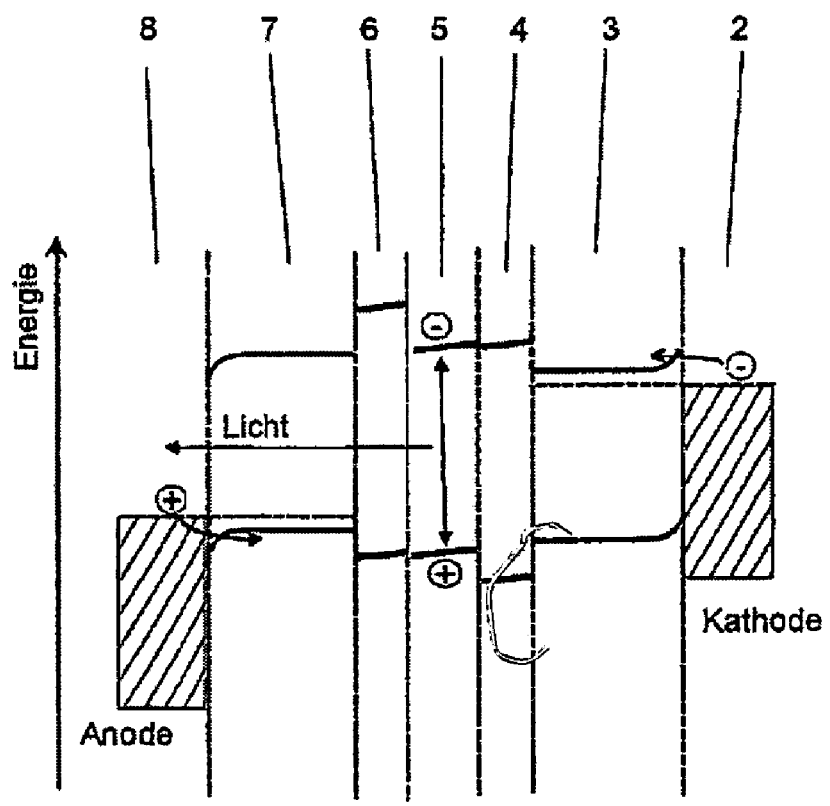

According to the invention, the disadvantage of prior structures is avoided by inverted OLEDs with doped injecting and transporting layers, optionally in combination with block layers 4, 6. FIG. 2 shows an exemplary apparatus in which the hole-injecting and -conducting layer 7 is doped, so that the boundary layer to the contact (anode 8) constitutes a space charge zone. The doping is high enough so that this space charge zone can be easily tunneled through. That such dopings are possible has already been shown in the literature for non-inverted light-emitting diodes (e.g., X. Q. Zhou et al., *Appl. Phys. Lett.* 78, 410 (2001); J. Blochwitz et al., *Organic Electronics* (2001), in press).

The apparatus according to the present invention has the following advantages: (1) Excellent injection of charge carriers from the anode into the p-doped charge carrier transporting layers; (2) Independence from detailed preparation of hole-injecting anode contact material 8; and (3) Possibility of choosing a material for layer 8 with a comparatively high barrier to hole injection In a preferred embodiment, by way of example, a solution will here be specified in which the combination of p-doped injecting and transporting layer and block layer 4, 6 is employed on the hole side only. The OLED exhibits the following layer structure:

Substrate 1, e.g., glass
Cathode 2: 1 nm LiF in combination with aluminum (LiF improves injection at the contact)
Electroluminescent and (in this case) conventional electron-conducting layer 5: 65 nm Alq, possibly to be replaced by 30 nm Alq and 15 nm Alq doped with about 1% of an emitter dye such as quinacridone
Hole-side block layer 6: 5 nm triphenyldiamine (TPD)
p-Doped layer (Hole transporting layer 7): 100 nm Starburst TDATA 50:1 doped with $F_4$-TCNQ
Transparent electrode (anode 8): indium tin oxide (ITO)

The mixed layer 7 is produced in a process of vapor deposition under vacuum in mixed evaporation. In principle, such layers may also be produced by other methods, such as for example a vapor deposition of the substances one upon another, possibly with ensuing temperature-controlled diffusion of the substances one into another, or by other application (e.g. spin-coating) of the already mixed substances within or outside of the vacuum. The block layer 6 was also vapor deposited under vacuum but may alternatively be produced otherwise, e.g., by spin-coating within or outside of the vacuum.

In another preferred embodiment by way of example, there may be an additional n-doped layer 3 between the cathode 2 and the electroluminescent layer 5. The doping may, as described above, consist in a mixed vapor deposition of two organic materials (species of molecules) or by incorporation of metal atoms in the organic layer (as described in, e.g., patent application Ser. No. DE 100 58 578.7 filed Nov. 25, 2000). As an example pursuant to the invention, mention may here be made of the doping of an aluminum complex of tris(8-quinolinolato) ("Alq") with Lithium (Li) (U.S. Pat. No. 6,013,384 (J. Kido et al.) filed Jan. 22, 1998; J. Kido et al., *Appl. Phys. Lett.* 73, 2866 (1998)). The use of such a layer, according to the present invention, in an inverted OLED structure, results in the positive effect of a lithium fluoride layer between the electron-transporting layer 3 and the metal layer of the cathode 2, which is achieved in an uninverted structure of the OLED (the vapor deposition of 'hot' metal atoms on LiF achieves the desired effect on the electron injection) see e.g. M. G. Mason, *J. Appl. Phys.* 89, 2756 (2001)), is achieved for the inverted structure as well. The LiF layer lowers the work-function of the cathode 2 material (e.g., aluminum) and the Li-doping of the electron-transporting layer 3 (typically, and in conformity with the invention, in a concentration between 5:1 and 1:10 Li atoms to $Alq_3$ molecules) makes possible a band bending at the boundary surface of the cathode, permitting an efficient injection of electrons, much as in the case of hole injection into the p-doped hole-transporting layer.

According to the present invention, the use of doped layers makes it possible to achieve the same low operating voltages and high efficiencies in an inverted structure with light emission through the cover contact as in a conventional structure with emission through the substrate 1. This is due, as described, to the efficient hole injection, which, due to the doping, is relatively independent of the exact work-function of the transparent anode material. Thus, highly efficient displays can be built on conventional semiconductor substrates.

Although only some preferred applications have been described, it will be obvious to those skilled in the art that many modifications and variations of the invention presented are possible in the spirit of the invention. For example, other transparent contacts than ITO may be used as anode materials (e.g., as in H. Kim et al., *Appl. Phys. Lett.* 76, 259 (2000); H. Kim et al, *Appl. Phys. Lett.* 78, 1050 (2001)).

Furthermore, it would be in conformity with the invention to compose the transparent anode of a sufficiently thin layer of a non-transparent material (e.g., silver or gold) and a thick layer of a transparent conductive material.

The invention claimed is:

1. An organic light-emitting diode comprising:
   a substrate;
   at least one light-emitting layer;
   at least one charge carrier transport layer;
   a bottom electrode namely a cathode at the substrate; and
   a top electrode namely an anode wherein light emission is through the anode, wherein the at least one charge carrier transport layer is disposed directly beneath the anode, and is p-doped with an organic material, wherein the p-doped charge carrier transport layer has a layer thickness greater than 100 nm and wherein the substrate, the at least one light emitting layer, the at least one charge carrier transport layer, the cathode and the anode are arranged in an inverted LED structure, and wherein the p-doped charge carrier transport layer has a layer thickness greater than 100 nm to protect the underlying layers from damage in the fabrication of the anode.

2. The organic light-emitting diode according to claim 1, further comprising a block layer between the charge carrier transport layer and the light-emitting layer.

3. The organic light-emitting diode according to claim 2, wherein the thickness of the block layer is from about 0.1 nm to about 50.

4. The organic light-emitting diode according to claim 1, further comprising an electron transport layer between the cathode and the light-emitting layer.

5. The organic light-emitting diode according to claim 4, further comprising:
a block layer between the electron transport layer and the light-emitting layer, and
an another block layer between the light-emitting layer and the charge carrier transport layer.

6. The organic light-emitting diode according to claim 5, wherein the electron transport layer is doped.

7. The organic light-emitting diode according to claim 6, further comprising:
a block layer between the electron transport layer and the light-emitting layer; and
an another block layer between the light-emitting layer and the charge carrier transport layer.

8. The organic light-emitting diode according to claim 4, further comprising a contact-improving layer between the electron transport layer and the cathode.

9. The organic light-emitting diode according to claim 4, wherein the electron transport layer is n-doped by mixing an organic main substance and a donor-type doping substance.

10. The organic light-emitting diode according to claim 9 wherein the molar concentration ratio of organic main substance to donor-like doping substance in the electron transport layer is from about 1:100,000 to about 5:1.

11. The organic light-emitting diode according to claim 4, wherein the thickness of the electron transport layer is from about 0.1 nm to about 50.

12. The organic light-emitting diode according to claim 1, further comprising a contact-improving layer between the anode and the charge carrier transport layer.

13. The organic light-emitting diode according to claim 1, wherein the cathode is located on a transparent substrate.

14. The organic light-emitting diode according to claim 1, wherein the light-emitting layer is a mixed layer of several materials.

15. The organic light-emitting diode according to claim 1, wherein the charge carrier transport layer comprises an organic main substance and an acceptor-type doping substance.

16. The organic light-emitting diode according to claim 15 wherein the molar concentration ratio of organic main substance to acceptor-like doping substance in the charge carrier transport layer is from about 1:100,000 to about 5:1.

17. The organic light-emitting diode according to claim 1, wherein the anode is transparent.

18. The organic light-emitting diode according to claim 17, wherein the anode further comprises a protective layer.

19. The organic light-emitting diode according to claim 1, wherein the anode is at least semi-transparent.

20. The organic light-emitting diode according to claim 19, wherein the anode further comprises a protective layer.

21. The organic light-emitting diode according to claim 19, wherein the at least semi-transparent metallic anode further comprises a transparent contact layer to enhance transverse conduction.

22. The organic light-emitting diode according to claim 1, wherein the sequences of charge carrier transport layer and anode is repeated several times in one component.

23. The organic light-emitting diode according to claim 1, wherein the thickness of at least one of the charge carrier transport layer and the light-emitting layer is from about 0.1 nm to about 50.

* * * * *